US011749579B2

(12) United States Patent
Patil et al.

(10) Patent No.: US 11,749,579 B2
(45) Date of Patent: Sep. 5, 2023

(54) THERMAL STRUCTURES ADAPTED TO ELECTRONIC DEVICE HEIGHTS IN INTEGRATED CIRCUIT (IC) PACKAGES

(71) Applicant: QUALCOMM Incorporated, San Diego, CA (US)

(72) Inventors: Aniket Patil, San Diego, CA (US); Hong Bok We, San Diego, CA (US); Bohan Yan, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 107 days.

(21) Appl. No.: 17/188,236

(22) Filed: Mar. 1, 2021

(65) Prior Publication Data
US 2022/0278016 A1 Sep. 1, 2022

(51) Int. Cl.
*H01L 23/367* (2006.01)
*H01L 21/48* (2006.01)
(Continued)

(52) U.S. Cl.
CPC ...... *H01L 23/3675* (2013.01); *H01L 21/4871* (2013.01); *H01L 21/563* (2013.01);
(Continued)

(58) Field of Classification Search
CPC ............. H01L 2924/181; H01L 21/563; H01L 21/4871; H01L 25/0562; H01L 25/18;
(Continued)

(56) References Cited

U.S. PATENT DOCUMENTS 5,587,882 A 12/1996 Patel
2004/0188814 A1* 9/2004 Houle ..................... H01L 23/42
438/106
(Continued)

FOREIGN PATENT DOCUMENTS

WO 2017123188 A1 7/2017

OTHER PUBLICATIONS

International Search Report and Written Opinion for International Patent Application No. PCT/US2022/070451, dated May 30, 2022, 16 pages.

*Primary Examiner* — Alonzo Chambliss
(74) *Attorney, Agent, or Firm* — Withrow & Terranova, PLLC

(57) ABSTRACT

An IC package includes a heat-generating device and an electrical device on a surface of a substrate, a mold compound disposed on the electrical device, and a thermal structure disposed on the heat-generating device, without the mold compound, to improve heat dissipation. In an example, the thermal structure includes a thermal interface material (TIM) layer and a heat sink. In the example, the TIM layer extends from the heat-generating device to a height equal to or less than the mold compound and the heat sink includes a planar exterior surface above the heat-generating device and the electrical device. In an example, a first heat sink portion of the heat sink on the heat-generating device may be a different thickness than a second heat sink portion of the heat sink on the electrical device. The thermal structure reduces a thermal resistance between the heat-generating device and the heat sink.

22 Claims, 13 Drawing Sheets

(51) Int. Cl.
    *H01L 21/56* (2006.01)
    *H01L 23/31* (2006.01)
    *H01L 23/36* (2006.01)
    *H01L 23/495* (2006.01)
    *H01L 23/00* (2006.01)
    *H01L 25/065* (2023.01)
    *H01L 25/18* (2023.01)
    *H01L 23/498* (2006.01)
    *H01L 23/64* (2006.01)

(52) U.S. Cl.
    CPC ...... *H01L 23/3128* (2013.01); *H01L 23/3185* (2013.01); *H01L 23/36* (2013.01); *H01L 23/49568* (2013.01); *H01L 23/49816* (2013.01); *H01L 24/32* (2013.01); *H01L 24/81* (2013.01); *H01L 25/0652* (2013.01); *H01L 25/18* (2013.01); H01L 23/642 (2013.01); H01L 23/645 (2013.01); H01L 23/647 (2013.01); H01L 24/83 (2013.01); H01L 2224/32258 (2013.01); H01L 2924/181 (2013.01)

(58) Field of Classification Search
    CPC ........... H01L 23/49568; H01L 23/3185; H01L 24/32; H01L 24/81; H01L 23/3128; H01L 23/49816; H01L 25/0652
    See application file for complete search history.

(56) References Cited

U.S. PATENT DOCUMENTS

| | | | | |
|---|---|---|---|---|
| 2006/0091530 | A1* | 5/2006 | Wang | H01L 23/42 |
| | | | | 257/E25.023 |
| 2008/0237840 | A1* | 10/2008 | Alcoe | H01L 23/42 |
| | | | | 257/706 |
| 2010/0181665 | A1 | 7/2010 | Casey et al. | |
| 2011/0068459 | A1* | 3/2011 | Pagaila | H01L 24/81 |
| | | | | 257/E23.141 |
| 2014/0239482 | A1 | 8/2014 | Kourakata et al. | |
| 2015/0084178 | A1* | 3/2015 | Kim | H01L 23/544 |
| | | | | 257/706 |
| 2015/0170989 | A1* | 6/2015 | Dhavaleswarapu | H01L 23/3675 |
| | | | | 438/122 |
| 2015/0340303 | A1* | 11/2015 | Oh | H01L 25/071 |
| | | | | 438/109 |
| 2019/0148261 | A1* | 5/2019 | Wu | H01L 21/4882 |
| | | | | 257/684 |
| 2019/0348340 | A1 | 11/2019 | Kwon | |
| 2020/0075503 | A1* | 3/2020 | Chuang | H01Q 1/2283 |

* cited by examiner

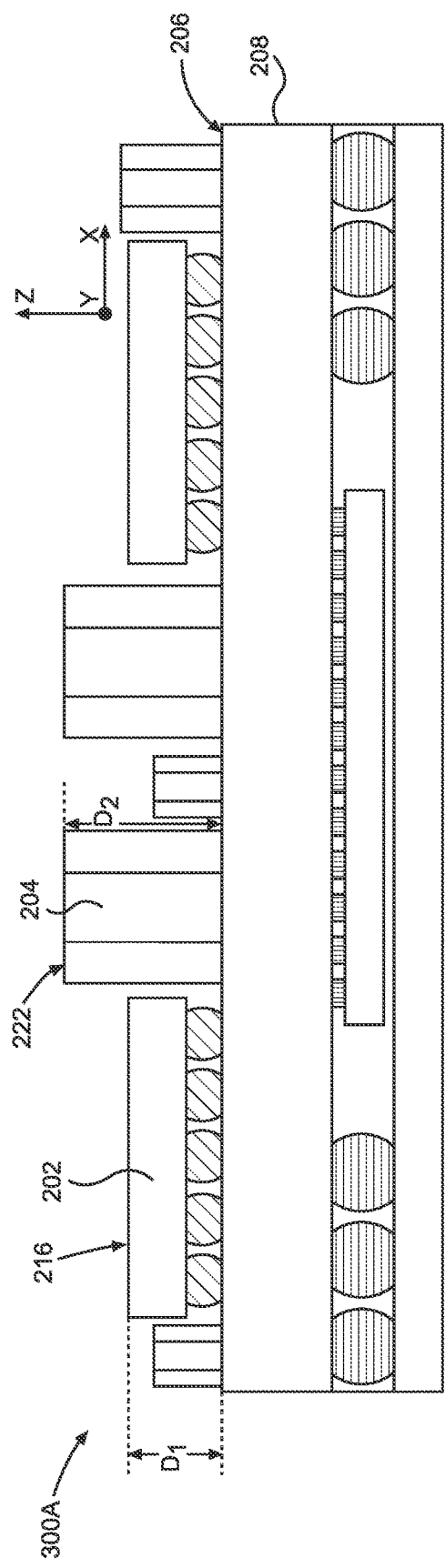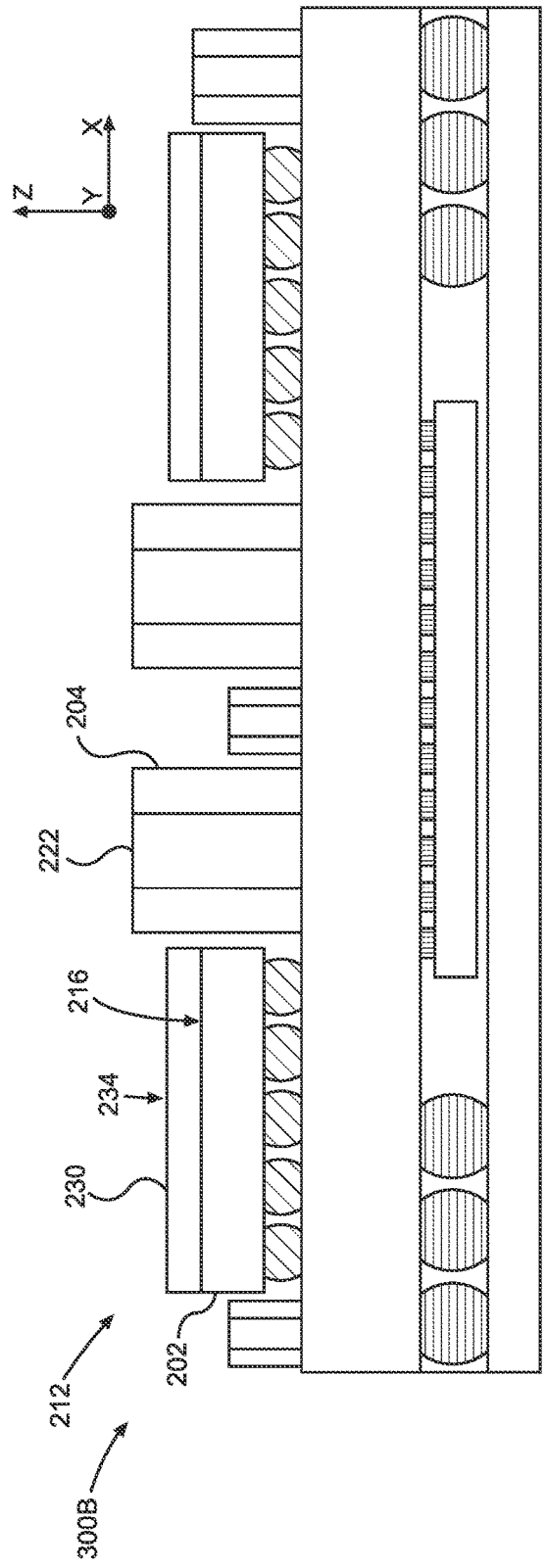

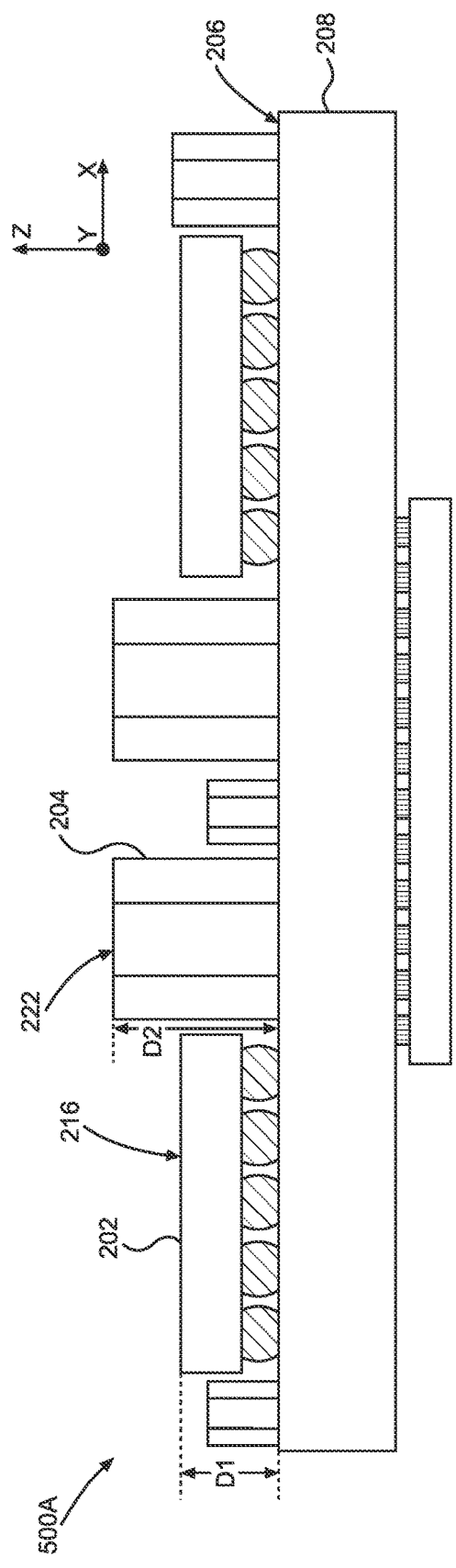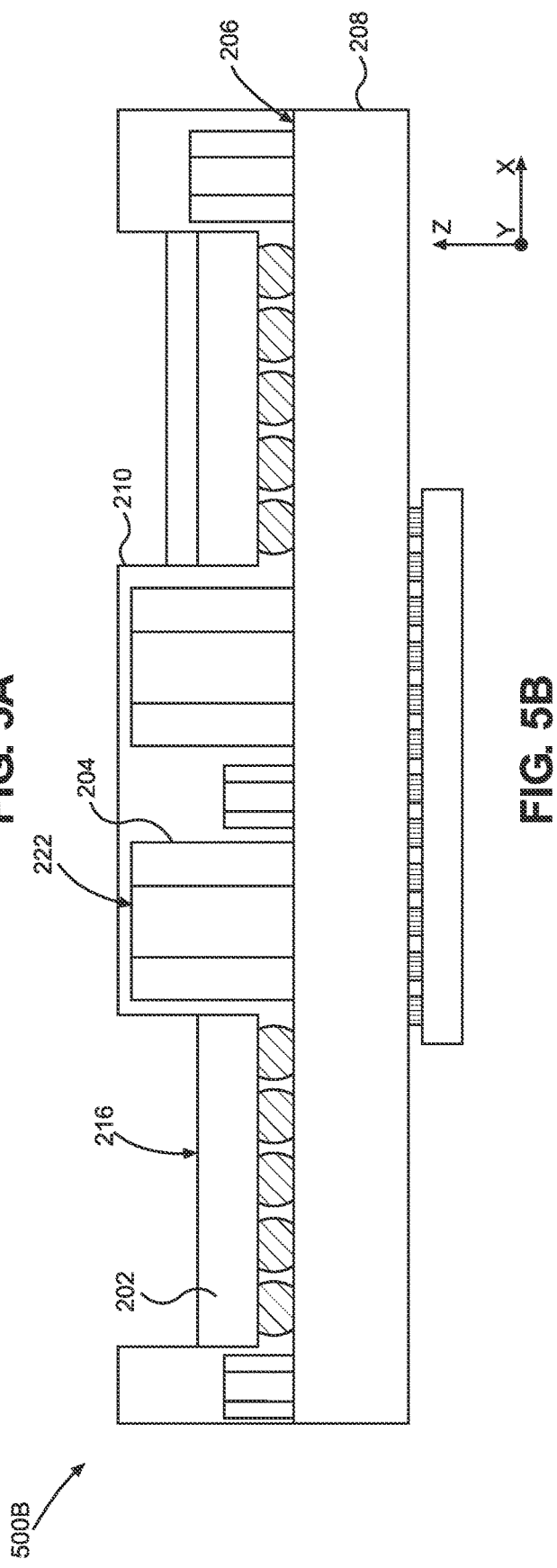

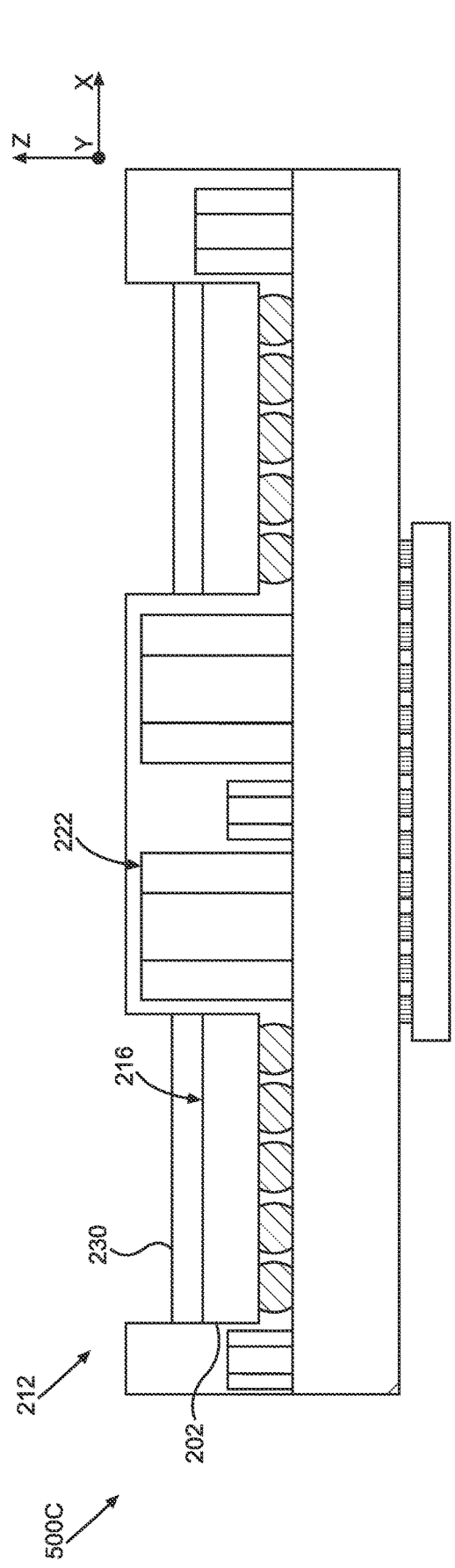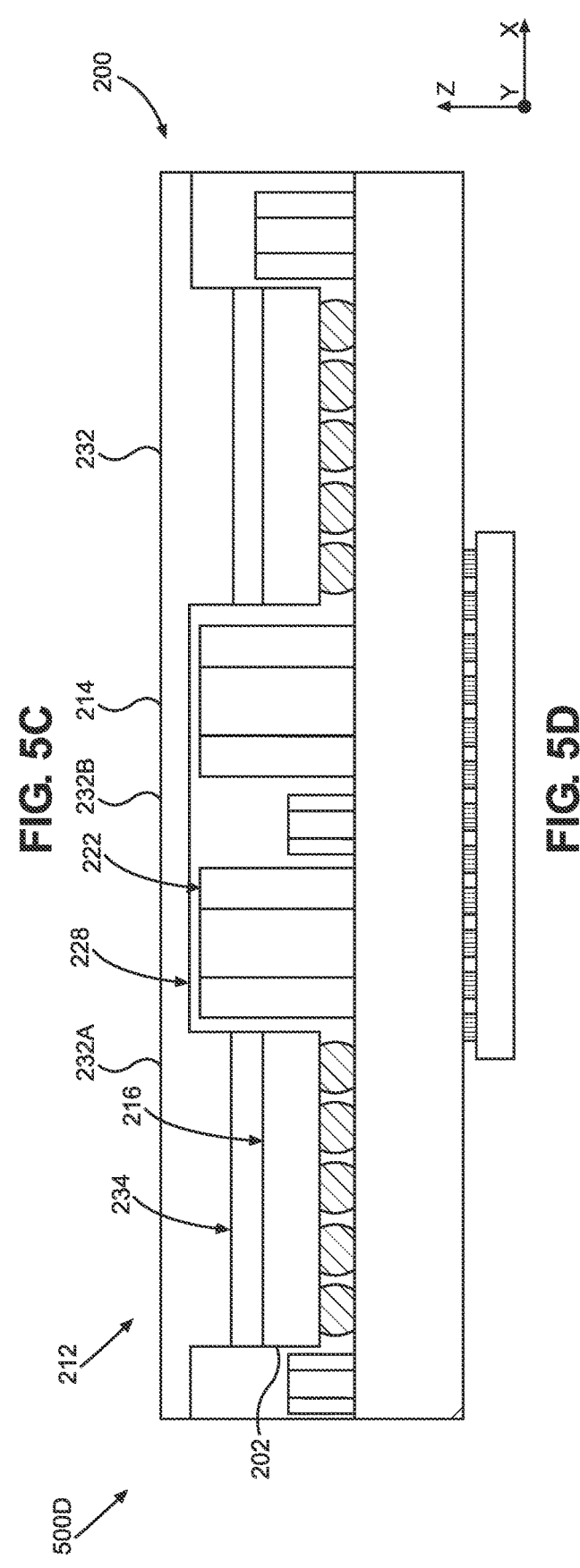

THERMAL STRUCTURES ADAPTED TO ELECTRONIC DEVICE HEIGHTS IN INTEGRATED CIRCUIT (IC) PACKAGES

BACKGROUND

I. Field of the Disclosure

The field of the disclosure relates generally to removing excess heat generated in an integrated circuit (IC) package.

II. Background

Mobile devices are capable of complex functionality provided by an application processor executing application software. The application processor is typically one of several electronic devices coupled to a substrate in an integrated circuit (IC) package. An IC package may also include circuits for receiving, amplifying, and transmitting radio-frequency (RF) signals to provide a wireless interface capability. Other electronic devices on a substrate in an IC package include memory chips, power management integrated circuits (PMICs), and surface mount devices (SMDs). PMICs are active devices employed to provide power to other electronic devices such as the application processor. SMDs may be passive electrical components that are needed to process the RF signals. PMICs and some other devices generate a large amount of heat that must be removed from the IC package to avoid negative performance effects, and even premature device failure, caused by high temperatures. Therefore, after securing all the components on a substrate within a bonding encapsulant, a thermal dissipation solution (e.g., heat sink or heat pipe) is provided on a package exterior to conduct away excess heat generated within the package.

SUMMARY OF THE DISCLOSURE

Aspects disclosed herein include thermal structures adapted to electronic device heights in integrated circuit (IC) packages. IC packages include a plurality of electronic devices of different heights coupled to a surface of a substrate. IC packages have a planar exterior surface above the electronic devices of different heights. In this regard, a mold compound is disposed on the surface of the substrate to a constant depth that covers the tallest electronic device(s). A thermal structure is disposed on the surface of the mold compound to dissipate heat generated by the devices. The thermal structure may also provide a planar exterior surface of the IC package. In existing IC packages, heat generated by a low height heat-generating device, such as a power management integrated circuit (PMIC), must be conducted through a thickness of the mold compound to the thermal structure. However, the mold compound is a poor thermal conductor.

In an exemplary aspect, an IC package includes a heat-generating device and an electrical device on a surface of a substrate, a mold compound disposed on the electrical device, and a thermal structure disposed on the heat-generating device, without the mold compound, to improve heat dissipation. In an example, the thermal structure may include a thermal interface material (TIM) layer. In another example, the thermal structure may include a heat sink. In the example, the TIM layer extends in a thickness direction from the heat-generating device to a height (i.e., above the surface) equal to or less than a height of the mold compound on the electrical device, and the heat sink includes a planar exterior surface above the heat-generating device and the electrical device. In an example, a first heat sink portion of the heat sink on the heat-generating device may be a different thickness than a second heat sink portion of the heat sink on the electrical device. Disposing the TIM layer on the heat-generating device, without a mold compound on the heat-generating device, reduces a thermal resistance between the heat-generating device and the heat sink.

In this regard, in one aspect, an IC package is disclosed. The IC package includes a substrate including a surface. The IC package also includes a heat-generating device on the surface of the substrate. The heat-generating device includes a first surface at a first distance from the surface. The IC package also includes an electrical device on the surface of the substrate. The electrical device includes a second surface at a second distance greater than the first distance from the surface. The IC package also includes a mold compound disposed on the second surface of the electrical device and including a third surface at a third distance greater than the second distance from the surface. The IC package also includes a thermal structure formed on the first surface of the heat-generating device and on the third surface of the mold compound. The thermal structure includes a planar exterior surface.

In another aspect, a method of making an IC package is disclosed. The method includes coupling a heat-generating device to a surface of a substrate. The heat-generating device includes a first surface at a first distance from the surface. The method also includes coupling an electrical device to the surface. The electrical device includes a second surface at a second distance greater than the first distance from the surface. The method also includes forming a thermal structure on the first surface of the heat-generating device and spaced from the second surface of the electrical device and including a planar exterior surface.

BRIEF DESCRIPTION OF THE FIGURES

FIGS. 3A-3D are illustrations of fabrication stages in a first exemplary process of fabricating the IC package in FIG. 2;

FIGS. 5A-5D are illustrations of fabrication stages in a second exemplary process of fabricating the IC package in FIG. 2;

DETAILED DESCRIPTION

Figure 1:
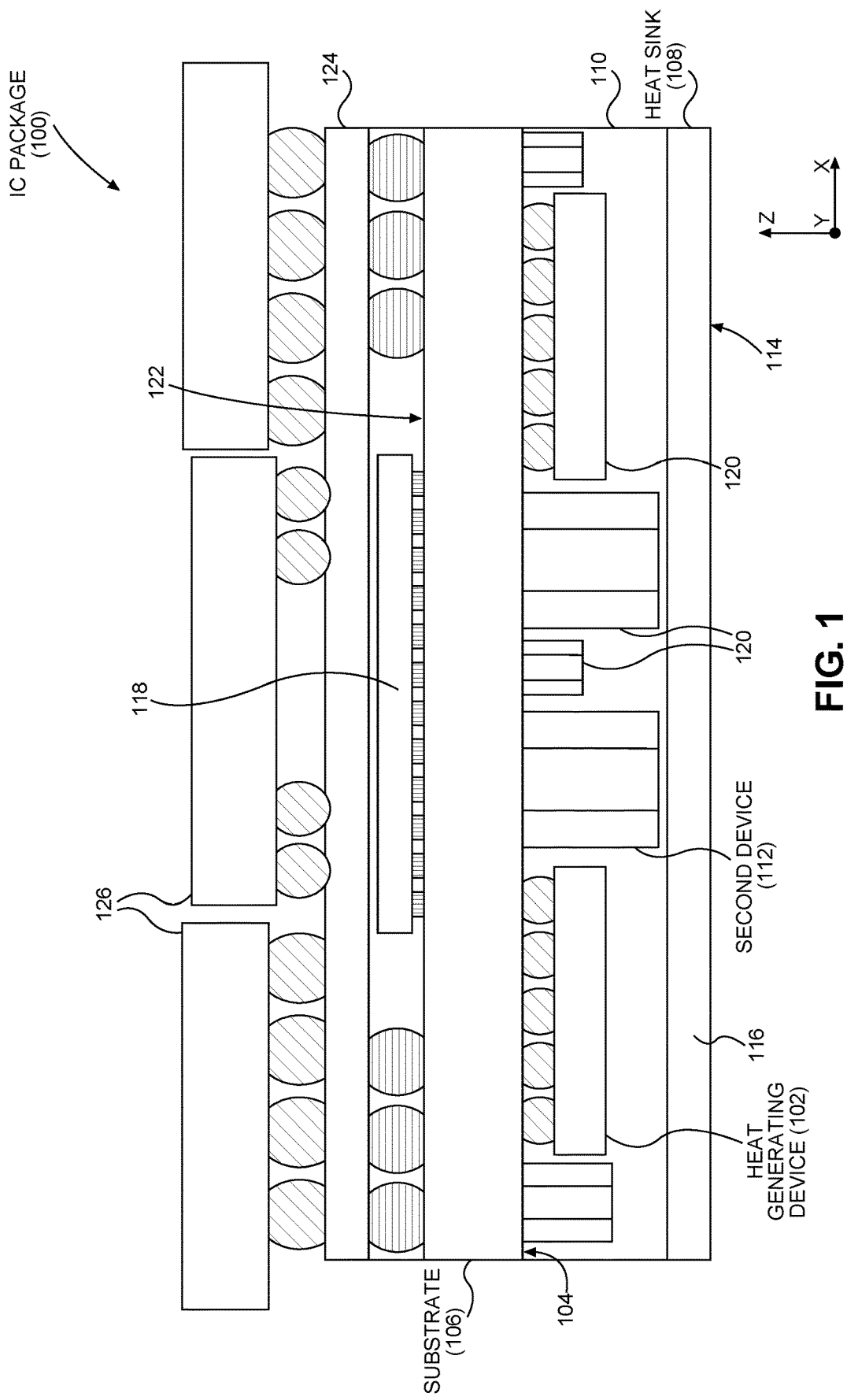
FIG. 1 is a cross-sectional side view of a conventional integrated circuit (IC) package including at least one heat-generating device, a heat sink over the heat-generating device, and a molding compound between the heat-generating device and the heat sink.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include thermal structures adapted to electronic device heights in integrated circuit (IC) packages. IC packages include a plurality of electronic devices of different heights coupled to a surface of a substrate. IC packages have a planar exterior surface above the electronic devices of different heights. In this regard, a mold compound is disposed on the surface of the substrate to a constant depth that covers the tallest electronic device(s). A thermal structure is disposed on the surface of the mold compound to dissipate heat generated by the devices. The thermal structure may also provide a planar exterior surface of the IC package. In existing IC packages, heat generated by a low height heat-generating device, such as a power management integrated circuit (PMIC), must be conducted through a thickness of the mold compound to the thermal structure. However, the mold compound is a poor thermal conductor.

In an exemplary aspect, an IC package includes a heat-generating device and an electrical device on a surface of a substrate, a mold compound disposed on the electrical device, and a thermal structure disposed on the heat-generating device, without the mold compound, to improve heat dissipation. In an example, the thermal structure may include a thermal interface material (TIM) layer. In another example, the thermal structure may include a heat sink. In the example, the TIM layer extends in a thickness direction from the heat-generating device to a height (i.e., above the surface) equal to or less than a height of the mold compound on the electrical device, and the heat sink includes a planar exterior surface above the heat-generating device and the electrical device. In an example, a first heat sink portion of the heat sink on the heat-generating device may be a different thickness than a second heat sink portion of the heat sink on the electrical device. Disposing the TIM layer on the heat-generating device, without a mold compound on the heat-generating device, reduces a thermal resistance between the heat-generating device and the heat sink.

FIG. 1 is a cross-sectional side view of a conventional IC package 100 provided for reference to explain a heat dissipation issue addressed by aspects disclosed herein. The IC package 100 includes at least one heat-generating device 102 on a surface 104 of a substrate 106, a heat sink 108 above the heat-generating device 102, and a mold compound 110 between the heat-generating device 102 and the heat sink 108. The heat sink 108 may include a TIM layer (not shown). The IC package 100 also includes, on the surface 104, at least one electrical device 112 that is taller than the heat-generating device 102. In this example, the surface 104 extends in an X-axis direction and a Y-axis direction orthogonal to the X-axis direction. A height of the electrical device 112 extends farther in a Z-axis direction orthogonal to the surface 104 than the heat-generating device 102. The mold compound 110 is disposed on the surface 104 to a depth that covers the electrical device 112, securing the heat-generating device 102 and the electrical device 112 on the substrate 106. Parallel to the surface 104, the mold compound 110 has a planar exterior surface 114 where the heat sink 108 is disposed. The heat sink 108 is formed of a material 116 with high thermal conductivity, such as copper, to remove heat from the IC package 100. However, the mold compound 110 is a poor thermal conductor. Therefore, the mold compound 110 does not effectively conduct heat generated in the heat-generating device 102 to the heat sink 108, causing an increase in temperature of the IC package 100.

The IC package 100 may include an application processor 118 or other devices 120 on the surface 104 or on an opposite surface 122 of the substrate 106. The IC package 100 may include an additional substrate 124 electrically coupled to the substrate 106 and also coupled to other devices 126. Performance of the application processor 118 and the other devices 120 and 126 can be negatively affected by an increase in temperature. In addition, excessive heat may also cause damage to the IC package 100 or premature failure of any device therein. Thus, an improvement is needed in the heat dissipation capability of the IC package 100.

Figure 2:
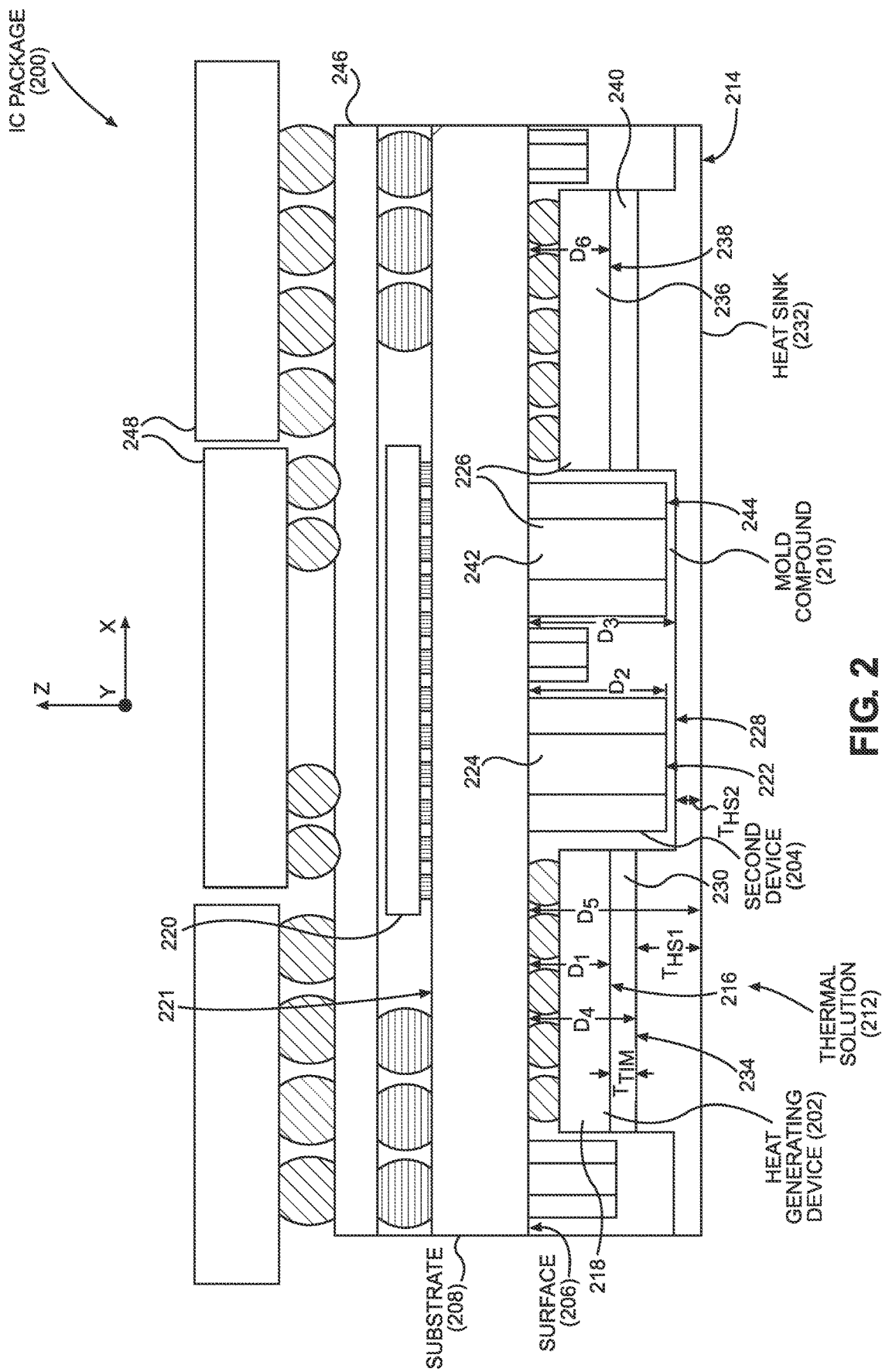
FIG. 2 is a cross-sectional side view of an exemplary IC package including a heat-generating device and a taller electrical device both mounted to a substrate, and a thermal structure above the electrical device and on the heat-generating device to improve conduction of heat from the heat-generating device.

FIG. 2 is a cross-sectional side view of an exemplary IC package 200 illustrating exemplary aspects of the IC package 200 for reference in the discussion below. The IC package 200 includes a heat-generating device 202 and an electrical device 204 that are each on (e.g., coupled to and/or mounted to) a surface 206 of a substrate 208. The IC package 200 includes a mold compound 210 disposed on the surface 206 of the substrate 208 and on the electrical device 204 but not on the heat-generating device 202. The IC package 200 includes a thermal structure 212 that is disposed on the heat-generating device 202. In this manner, thermal resistance between the heat-generating device 202 and a planar exterior surface 214 of the IC package 200 is reduced.

In an example, the heat-generating device 202 includes a first surface 216 opposite to the substrate 208. The first surface 216 is at a first distance $D_1$ from the surface 206 in a direction orthogonal to the first surface 216. For example, as illustrated in FIG. 2, the first surface 216 extends in an X-axis direction and a Y-axis direction orthogonal to the X-axis direction, and the distance $D_1$ is measured in a Z-axis direction orthogonal to the X-axis direction and the Y-axis direction. The heat-generating device 202, in an example, may be a PMIC die or PMIC package 218 that is provided in the IC package 200 to provide power to an IC 220, such as an application processor 220, or a package. Alternatively, the heat-generating device 202 may be an application processor, any integrated circuit or memory, such as a double data rate (DDR) static random-access memory (SRAM) or universal flash storage (UFS), or any other type of device mounted on a substrate in an IC package. As shown in FIG.

2, the application processor 220 may be mounted on a backside surface 221 of the substrate 208 opposite to the surface 206.

The electrical device 204 includes a second surface 222 at a second distance $D_2$ greater than the distance $D_1$ from the surface 206. The electrical device 204 in the example in FIG. 2 can be any surface mount device (SMD), such as a passive electrical component, operating in an electrical circuit. In addition, the electrical device 204 may be any active or passive electrical component or device that has a surface at a greater height above the substrate 208 than the heat-generating device 202. In one example, the electrical device 204 is an inductor 224 but may also be a capacitor or a resistor. An inductance or Q-factor can be increased by increasing a size of the inductor 224. Thus, the distance $D_2$ to the second surface 222 of the electrical device 204 may be at least two or more times the distance $D_1$ from the surface 206 to the first surface 216.

The mold compound 210 is disposed on the surface 206 beside the heat-generating device 202, the electrical device 204, and any other devices 226 on the surface 206. The mold compound 210 is also disposed on the second surface 222 of the electrical device 204 at the distance $D_2$ from the surface 206. The mold compound 210 also has a third surface 228 at a distance $D_3$ greater than the distance $D_2$ from the surface 206. The mold compound 210 is not disposed on the first surface 216 of the heat-generating device 202. Rather than filling a space above the first surface 216 with the mold compound 210, which is a poor thermal conductor, the thermal structure 212 is disposed on the first surface 216 of the heat-generating device 202. The thermal structure 212 also forms the planar exterior surface 214 of the IC package 200.

The thermal structure 212 in the example in FIG. 2 includes a TIM layer 230 and a heat sink 232. The TIM layer 230 may be a conductive paste or conductive tape, for example, disposed on the first surface 216 of the heat-generating layer 202. The TIM layer 230 may comprise, for example, metal fillers and/or carbon nanotubes to provide high thermal conductivity. The heat sink 232 has a high thermal conductivity and may be, for example, a metal layer such as copper. A thickness $T_{TIM}$ of the TIM layer 230 extends from the first surface 216 of the heat-generating device 202 to a fourth surface 234 of the TIM layer 230 that is at a distance $D_4$ from the surface 206. The distance $D_4$ is greater than the distance $D_1$ of the first surface 216 of the heat-generating device 202 and equal to or less than the distance $D_3$ of the third surface 228 of the mold compound 210 from the surface 206.

The heat sink 232 is disposed on the fourth surface 234 of the TIM layer 230 and also on the third surface 228 of the mold compound 210. Opposite to the fourth surface 234 and the third surface 228, the heat sink 232 includes the planar exterior surface 214 extending across the heat-generating device 202 and the electrical device 204. The planar exterior surface 214 is at a fifth distance $D_5$, greater than the distance $D_4$ of the fourth surface 234 of the TIM layer 230, from the surface 206. The fifth distance $D_5$ is also greater than the distance $D_3$ of the third surface 228 of the mold compound 210.

On the fourth surface 234 of the TIM layer 230, the heat sink 232 has a first thickness $T_{HS1}$ corresponding to a difference between the distance $D_5$ and the distance $D_4$. On the third surface 228 of the mold compound 210, the heat sink 232 has a second thickness $T_{HS2}$ corresponding to a difference between the distance $D_5$ and the distance $D_3$. In the thermal structure 212, the TIM layer 230 is disposed on the first surface 216 of the heat-generating device 202. In this regard, "disposed on" means that there is no mold compound 210 between the TIM layer 230 and the first surface 216. The TIM layer 230 may be directly on the first surface 216 without intervening layers or there may be one or more intervening layers that are, for example, beneficial to heat conduction with low thermal resistance. In addition, the heat sink 232 has a first thickness $T_{HS1}$ and a second thickness $T_{HS2}$ according to the distances $D_3$ and $D_4$, to provide a low thermal resistance heat conduction path away from the heat-generating device 202 while still providing the planar exterior surface 214 of the IC package 200.

In the example in FIG. 2, the IC package 200 also includes a second heat-generating device 236 including a sixth surface 238 at a distance $D_6$ that is equal to or less than the second distance $D_2$ of the second surface 222 from the surface 206. The IC package 200 includes a second TIM layer 240 on the sixth surface 238 between the second heat-generating device 236 and the heat sink 232 to provide a low thermal resistance heat conduction path from the second heat-generating device 236 to the heat sink 232.

As shown in the example in FIG. 2, the IC package 200 also includes a third device 242 such as a SMD and/or passive device. The third device 242 includes a seventh surface 244 that is greater than the distance $D_1$ of the heat-generating device 202 from the surface 206. The mold compound 210 is disposed on the seventh surface 244 between the third device 242 and the heat sink 232.

The IC package 200 in FIG. 2 also includes a second substrate 246 coupled to the backside surface 221 of the substrate 208. Additional IC devices 248 (e.g., memory chips) are coupled to the second substrate 246 for access by the application processor 220, for example, or other devices on the substrate 208.

Examples of Dimensions of Features of the IC Package 200 are as Follows distance $D_1$=~400 microns (μm);
distance $D_2$=400 μm to 750 μm;
distance $D_3$=distance $D_2$+>50 μm=700 μm to 1 millimeter (mm),
distance $D_4$=distance $D_1$+100 to 200 μm;
distance $D_5$=distance $D_3$+>25 μm;
$T_{HS1}$=~200 μm; and
$T_{HS2}$=>25 μm.

IC packages including the exemplary aspects disclosed herein are not limited to the above dimensions.

Figure 3C:
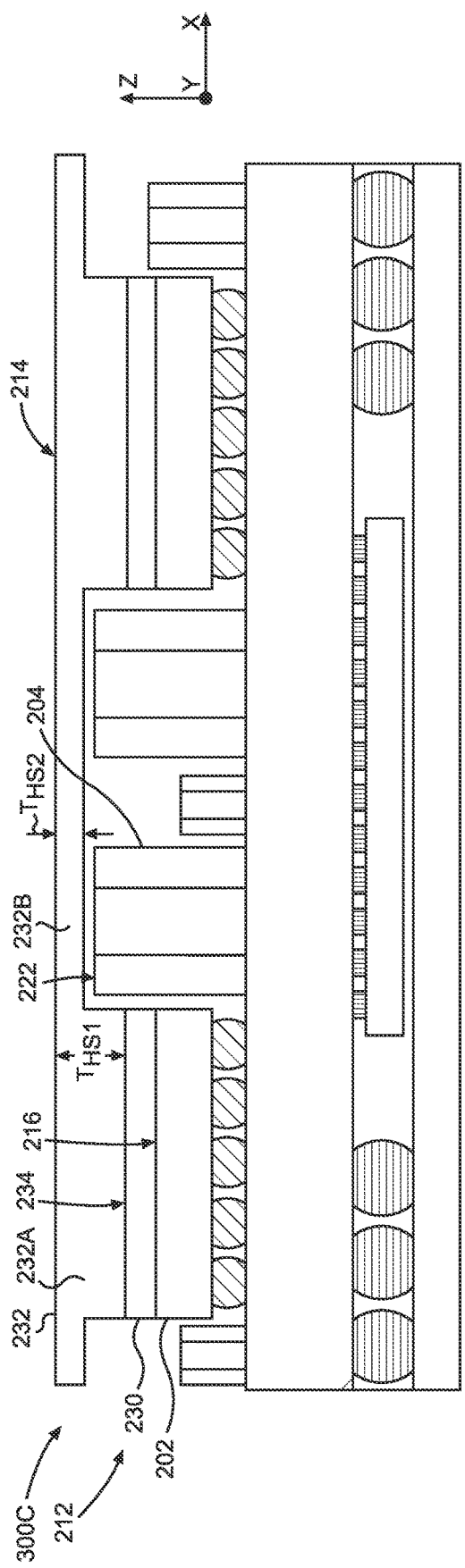
Figure 3D:
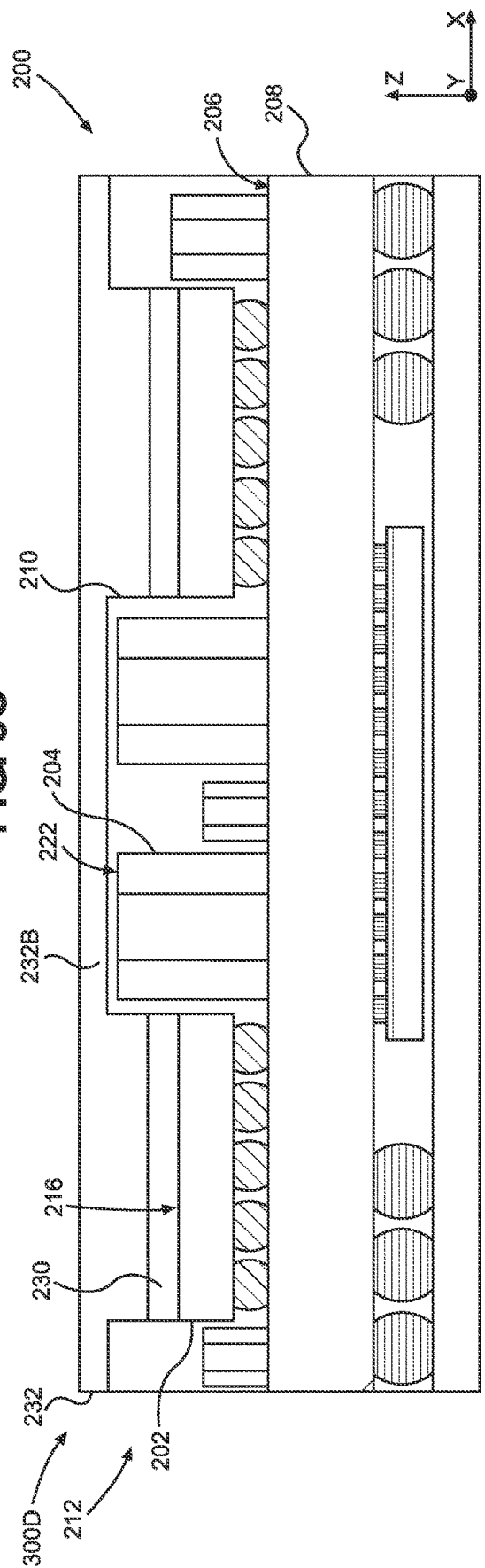
Figure 4:
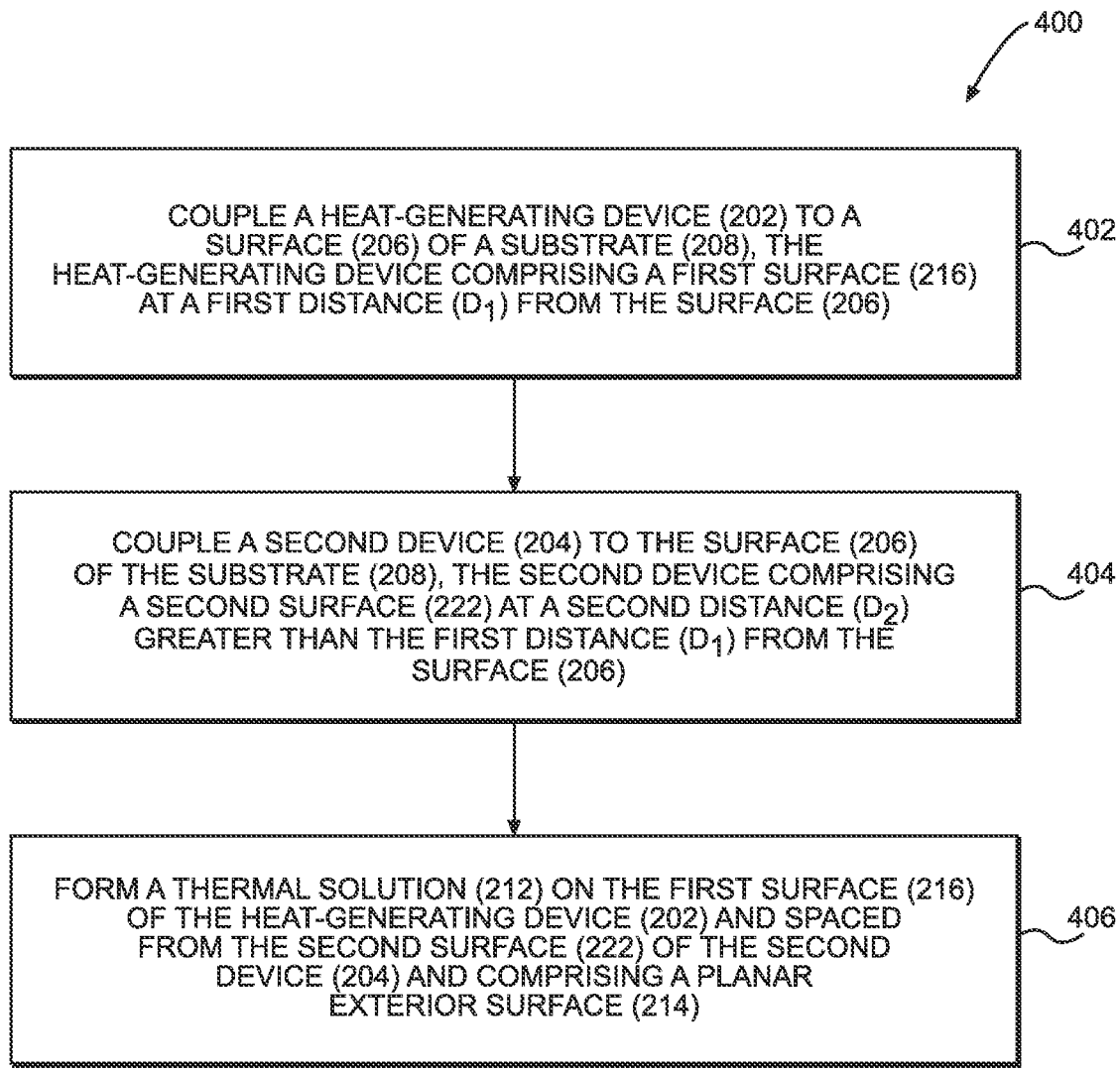
FIG. 4 is a flowchart illustrating the first exemplary process including the fabrication stages of FIGS. 3A-3D.

FIGS. 3A-3D are illustrations of fabrication stages 300A-300D corresponding to steps in a first example of an exemplary process 400 illustrated in the flowchart in FIG. 4 for fabricating the IC package 200 in FIG. 2. The fabrication stage 300A in FIG. 3A corresponds to a step of coupling the heat-generating device 202 to the surface 206 of the substrate 208 (block 402). The heat generating device 202 includes the first surface 216 at the first distance $D_1$ from the surface 206. The fabrication stage 300A in FIG. 3A also corresponds to the step of coupling the electrical device 204 to the surface 206, the electrical device 204 including the second surface 222 at the second distance $D_2$ greater than the first distance $D_1$ from the surface 206 (block 404).

The fabrication stages 300B-300C in FIGS. 3B and 3C correspond to the step of forming a thermal structure 212 on the first surface 216 of the heat-generating device 202 and spaced from the second surface 222 of the electrical device 204, the thermal structure 212 including the planar exterior surface 214 (block 406). As shown in FIG. 3B, forming the thermal structure 212 includes forming the TIM layer 230 on the first surface 216 of the heat-generating device 202, the TIM layer 230 including the fourth surface 234. The illustration of fabrication stage 300C in FIG. 3C shows that forming the thermal structure 212 further includes forming a first portion 232A of the heat sink 232 on the fourth surface 234 of the TIM layer 230 and forming a second portion 232B of the heat sink 232 spaced from the second surface 222 of the electrical device 204, wherein the heat sink 232 includes the planar exterior surface 214 of the thermal structure 212. Forming the first portion 232A of the heat sink 232 includes forming the first portion 232A to have the first thickness $T_{HS1}$ extending from the fourth surface 234 of the TIM layer 230 to the planar exterior surface 214. Forming the second portion 232B of the heat sink 232 includes forming the second portion 232B to extend from the planar exterior surface 214 but to have the second thickness $T_{HS2}$ that is less than a distance from the planar exterior surface 214 to the second surface 222 of the electrical device 204, leaving the second portion 232B of the heat sink 232 spaced from the second surface 232 of the electrical device 204.

In an example, the process 400 may include and additional step (not shown in the flowchart in FIG. 4) corresponding to the fabrication stage 300D in FIG. 3D including disposing a mold compound 210 on the surface 206 of the substrate 208 and on the second surface 222 of the electrical device 204. In an example, disposing the mold compound 210 further includes injecting the mold compound 210 between the second surface 222 of the electrical device 204 and the second portion 232B of the heat sink 232, such as in a transfer mold process. In this regard, the mold compound 210 is injected or otherwise forced between the second portion 232B of the heat sink 232 where the heat sink 232 is spaced from the second surface 222 of the electrical device 204. Since the TIM layer 230 is disposed on the first surface 216 of the heat-generating device 202, no mold compound 210 is injected between the thermal structure 212 and the first surface 216. Thus, heat generated in the heat-generating device 202 does not need to traverse through the poorly-conductive mold compound 210 and instead has a low thermal resistance path to conduct heat away from the IC package 200.

FIGS. 5A-5D are illustrations of fabrication stages 500A-500D corresponding to steps in a second example of the exemplary process 400 illustrated in the flowchart in FIG. 4 for fabricating IC package 200 in FIG. 2. The fabrication stage 500A in FIG. 5A corresponds to the step 402 of coupling the heat-generating device 202 to the surface 206 of the substrate 208, the heat-generating device 202 including a first surface 216 at a distance $D_1$ from the surface 206. The fabrication stage 500A in FIG. 5A also corresponds to the step 404 of coupling the electrical device 204 to the surface 206, the electrical device 404 including the second surface 222 at a second distance $D_2$ greater than the first distance $D_1$ from the surface 206.

In contrast to the transfer molding process illustrated in FIG. 3D, the second example of the process 400 includes a step, corresponding to the fabrication stage 500B in FIG. 5B, of forming a mold compound 210 on the surface 206 of the substrate 208 and on the second surface 222 of the electrical device 204. The illustration of the fabrication stage 500B in FIG. 5B shows the result after forming the mold compound 210 on the first surface 216 of the heat-generating device 202 and removing the mold compound 210 from the first surface 216 of the heat-generating device 202. After removing the mold compound 210 from the first surface 216, the second example of the process 400 proceeds to step 406 corresponding to fabrication stages 500C and 500D.

The illustrations of fabrication stages 500C and 500D in FIGS. 5C and 5D correspond to the step 406 of forming the thermal structure 212 on the first surface 216 of the heat-generating device 202 and spaced from the second surface 222 of the electrical device 204 and including the planar exterior surface 214. That is, the illustration of fabrication stage 500C in FIG. 5C shows the TIM layer 230 formed on the first surface 216 of the heat-generating device 202, and the illustration of fabrication stage 500D in FIG. 5D shows the heat sink 232 formed on the fourth surface 234 of the TIM layer 230 and spaced from the second surface 222 of the electrical device 204. The mold compound 210 on the second surface 222 of the electrical device 204 causes the second heat sink portion 232B of the heat sink 232 to be spaced from the second surface 222 and disposed on the third surface 228 of the mold compound 210.

In an alternative example of the process 400 (not shown), the molding compound 210 may be selectively deposited on the desired surfaces and to the desired thicknesses, rather than depositing the mold compound 210 and subsequently removing the mold compound 210 from the first surface 216 of the heat-generating device 202, as shown in FIG. 5B.

Figure 6:
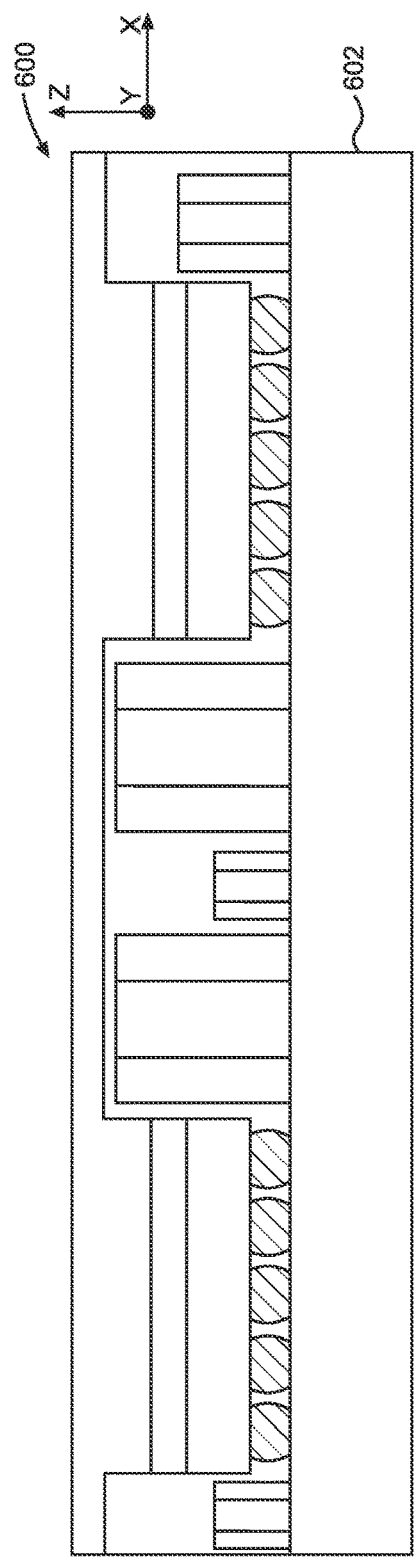
FIG. 6 is a cross-sectional side view illustrating a first orientation of a thermal structure disposed on a heat-generating device and an electrical device coupled to a substrate in an IC package, as shown in FIG. 2.
Figure 7:
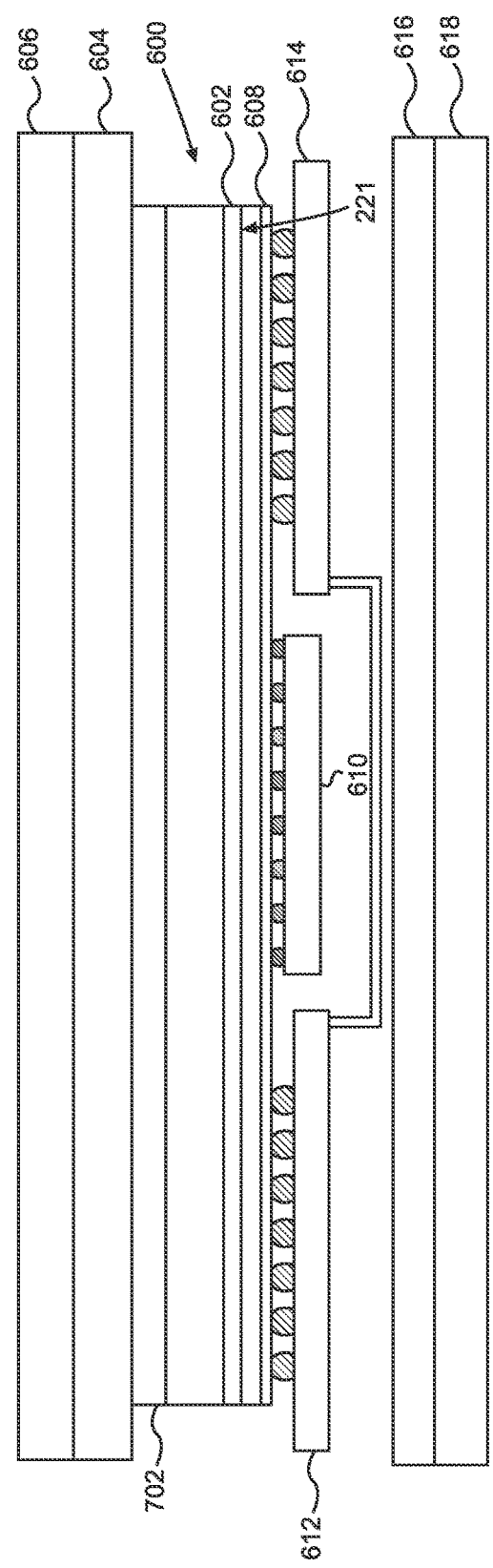
FIGS. 7 and 8 are cross-sectional side views of electronic devices including the IC package as shown in FIG. 2 in the orientation shown in FIG. 6 as part of a heat management solution.
Figure 8:
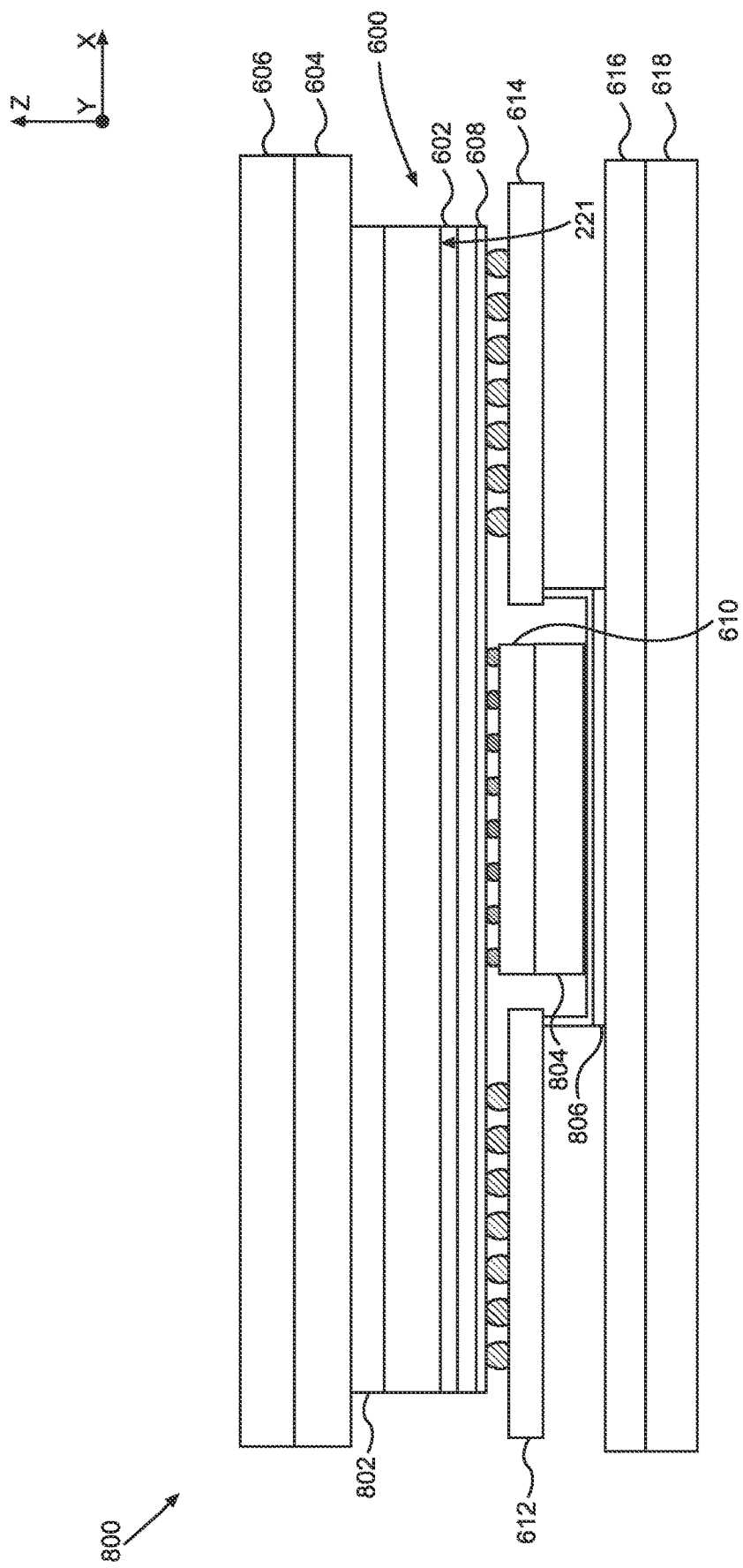
Figure 9:
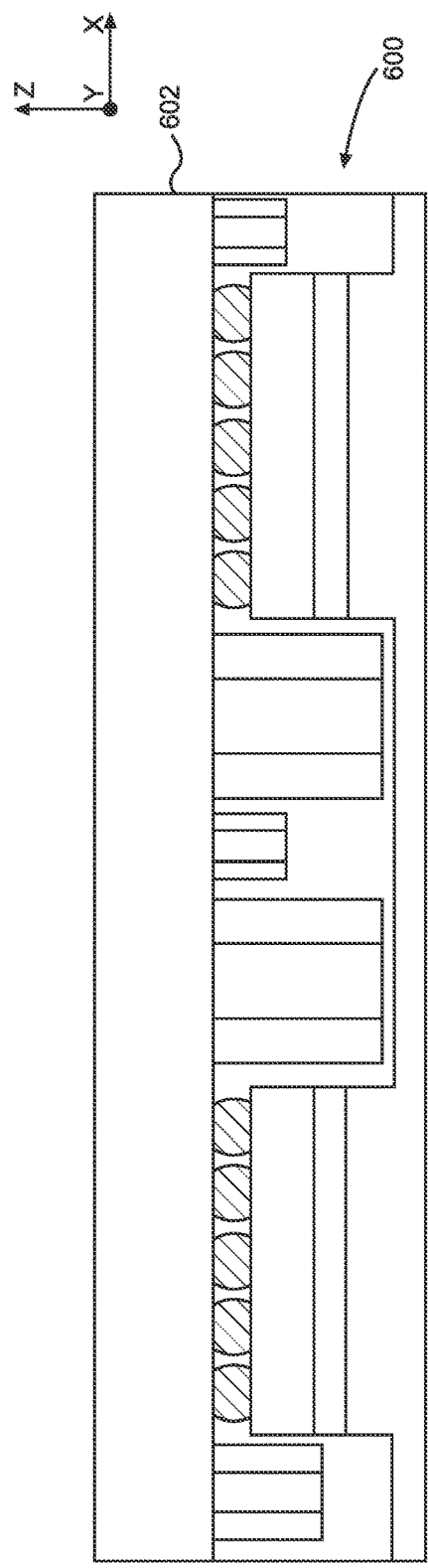
FIG. 9 is a cross-sectional side view illustrating a second orientation of the thermal structure disposed on a heat-generating device and an electrical device coupled to a substrate in an IC package, as shown in FIG. 2.

FIGS. 6-11 are provided to illustrate incorporating the thermal structure 212 in FIGS. 2, 3D, and 5D in electronic devices as part of a total heat management solution. FIG. 6 and FIG. 9 are cross-sectional side views illustrating a first orientation and a second orientation, respectively, of a structure 600 corresponding to the IC package 200 in FIG. 2. FIGS. 6 and 9 illustrate orientations of the structure 600 employed in the electronic devices shown in FIGS. 7, 8, 10, and 11. The substrate 602 in FIGS. 6-11 corresponds to the substrate 208 of FIG. 2.

FIGS. 7, 8, 10, and 11 illustrate examples of mobile devices 700, 800, 1000, 1100 that include a major cooling solution 604 disposed between a display 606 and an IC package corresponding to the IC package 200 in FIG. 2. The mobile devices 700, 800, 1000, 1100 each include an interposer substrate 608 coupled to the backside surface 221 of the substrate 602 (i.e., opposite to the surface 206 in FIG. 2). The examples of the mobile devices 700, 800, 1000, 1100 further include application processors 610 and printed circuit boards (PCBs) 612 and 614 coupled to the backside surface 221 of the substrate 602. The examples of the mobile devices 700, 800, 1000, 1100 in FIGS. 7, 8, 10, and 11 also include a backside cooling solution 616 coupled to a back cover 618 of the mobile devices 700, 800, 1000, 1100.

FIG. 7 illustrates a first example including the mobile device 700. The structure 600 in the mobile device 700 is oriented on the substrate 602 as shown in FIG. 6 facing the display 606. A TIM layer 702 is provided between the structure 600 and the major cooling solution 604. No additional thermal elements are provided between the structure 600 and the back cover 618.

FIG. 8 illustrates a second example including the mobile device 800. The structure 600 in the mobile device 800 is oriented on the substrate 602 as shown in FIG. 6 facing the display 606. In addition to a TIM layer 802 between the structure 600 and the major cooling solution 606, the mobile device 800 also includes TIM layers 804 and 806 conducting heat from the application processor 610 and PCBs 612 and 614 to the back cover 618.

FIG. 9 is a cross-sectional side view illustrating a second orientation of the structure 600 corresponding to the IC package 200 in FIG. 2. FIG. 9 is provided to illustrate an orientation of the structure 600 in the mobile devices 1000 and 1100 in FIGS. 10 and 11. The substrate 602 in FIGS. 9-11 corresponds to the substrate 208 of FIG. 2.

Figure 10:
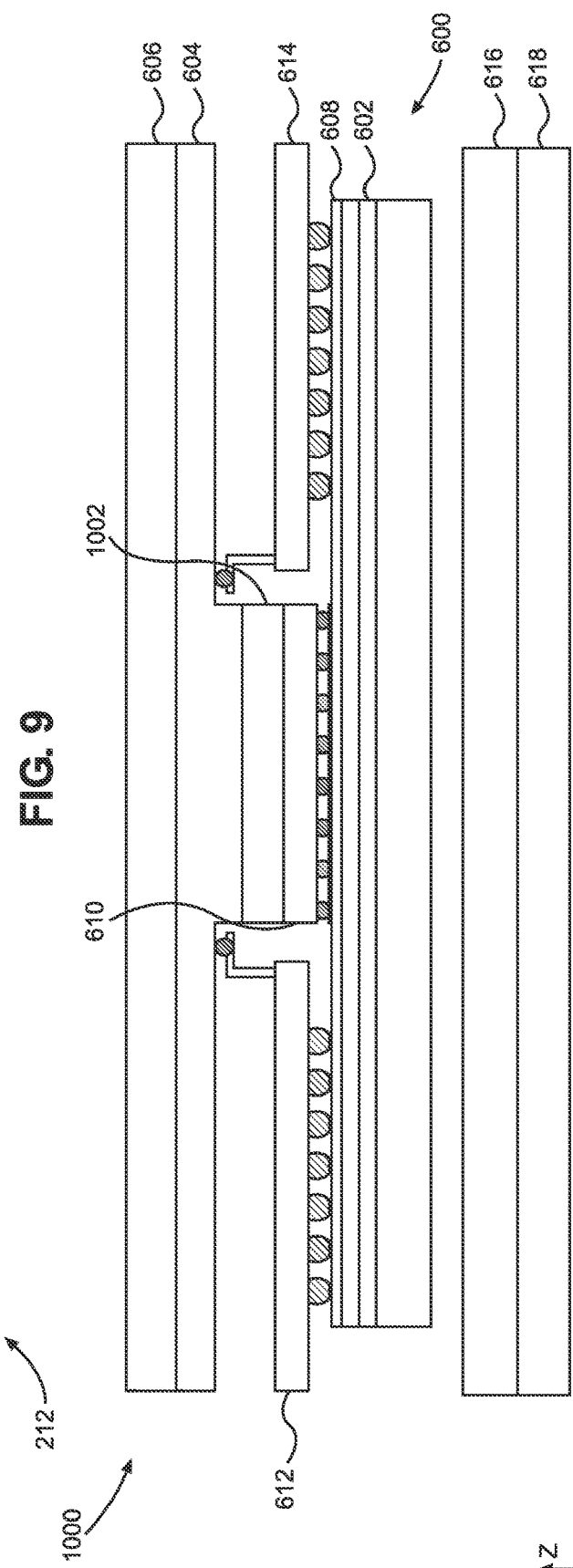
FIGS. 10 and 11 are cross-sectional side views of electronic devices including the IC package as shown in FIG. 2 in the orientation shown in FIG. 9 as part of a heat management solution.

FIG. 10 illustrates a third example including the mobile device 1000. The structure 600 in the mobile device 1000 is oriented on the substrate 602 as shown in FIG. 9, facing the back cover 618. A TIM layer 1002 is provided between the application processor 610 and the major cooling solution 604. No additional thermal elements are provided between the structure 600 and the back cover 618.

Figure 11:
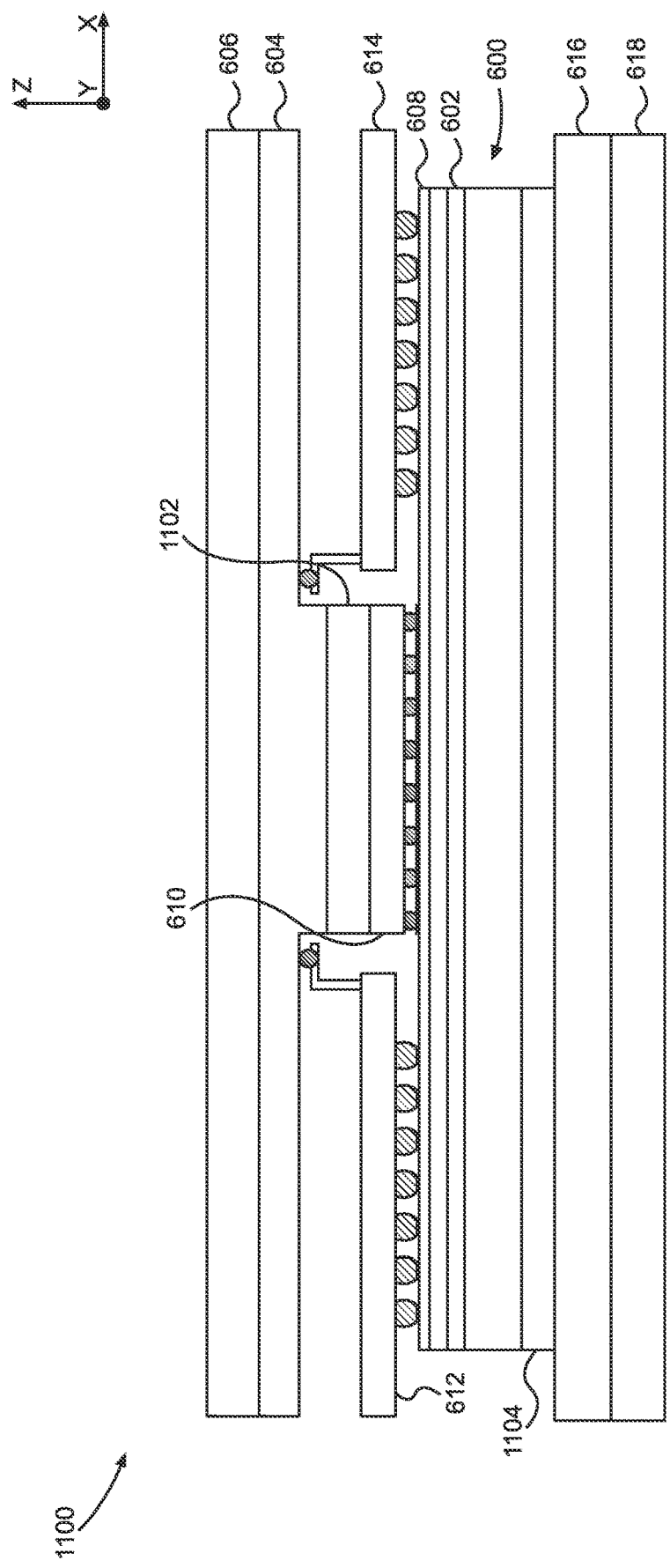

FIG. 11 illustrates a fourth example including the mobile device 1100. The structure 600 in the mobile device 6 1100 is oriented on the substrate 602 as shown in FIG. 9, facing the back cover 618. A TIM layer 1102 is provided between the application processor 612 and the major cooling solution 606, as in FIG. 10. In addition, a TIM layer 1104 is provided between the structure 600 and the backside cooling solution 616.

Figure 12:
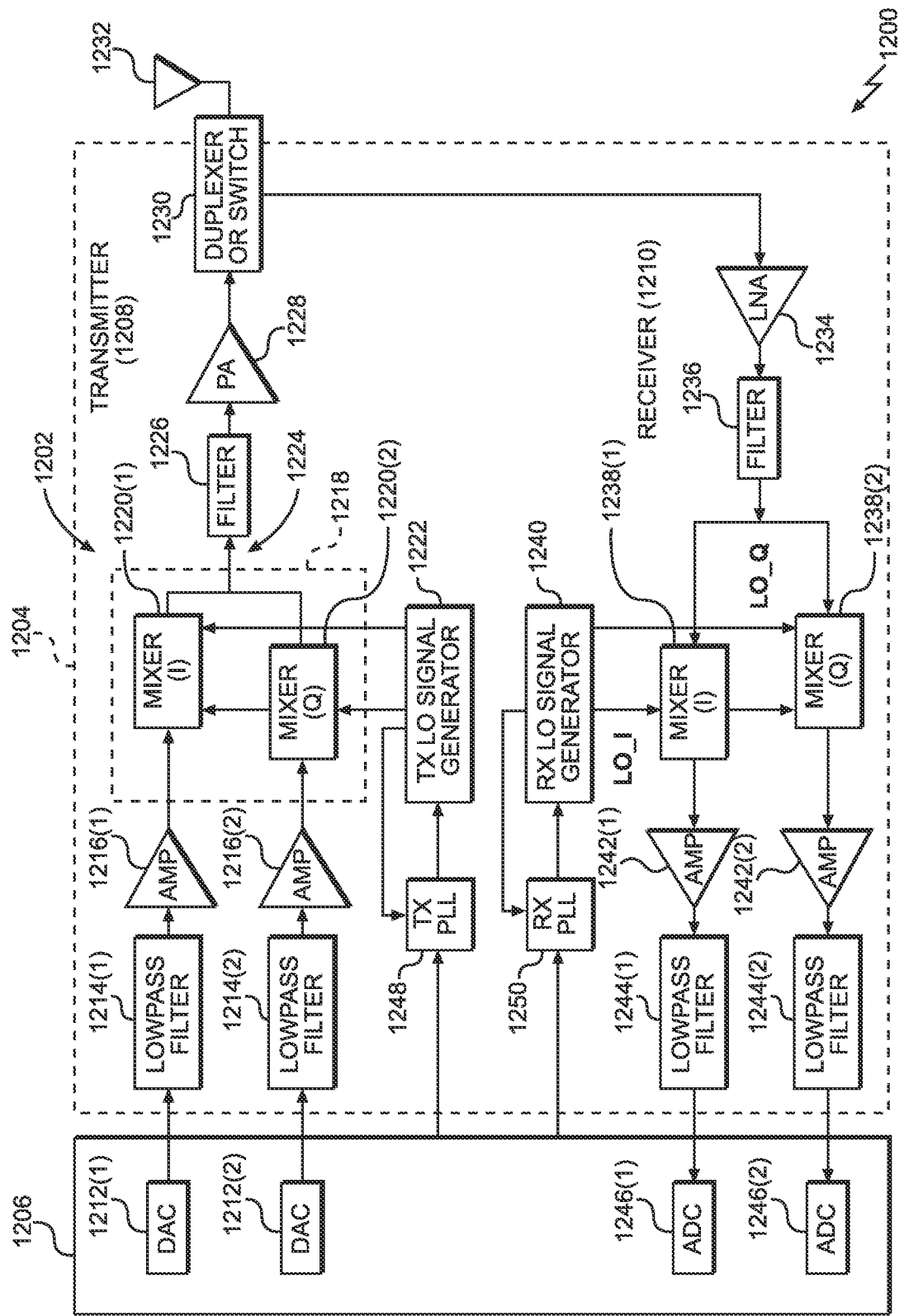
FIG. 12 is a block diagram of an exemplary wireless communications device that includes a radio frequency (RF) module including the IC package including a thermal structure in FIG. 2.

FIG. 12 illustrates an exemplary wireless communications device 1200 that includes radio frequency (RF) components formed from one or more integrated circuits (ICs) 1202, wherein any of the ICs 1202 can include an exemplary IC package including a heat-generating device and an electrical device on a surface of a substrate, and a thermal structure that is spaced from the electrical device and on a first surface of the heat-generating device to reduce thermal resistance for heat dissipation, as illustrated in FIGS. 2, 3D, and 5D, and according to any of the aspects disclosed herein. The wireless communications device 1200 may include or be provided in any of the above-referenced devices, as examples. As shown in FIG. 12, the wireless communications device 1200 includes a transceiver 1204 and a data processor 1206. The transceiver 1204 may also be referred to as an RF front end (RFFE) module 1204. The data processor 1206 may include a memory to store data and program codes. The transceiver 1204 includes a transmitter 1208 and a receiver 1210 that support bi-directional communications. In general, the wireless communications device 1200 may include any number of transmitters 1208 and/or receivers 1210 for any number of communication systems and frequency bands. All or a portion of the transceiver 1204 may be implemented on one or more analog ICs, RFICs, mixed-signal ICs, etc.

The transmitter 1208 or the receiver 1210 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 1200 in FIG. 12, the transmitter 1208 and the receiver 1210 are implemented with the direct-conversion architecture.

In the transmit path, the data processor 1206 processes data to be transmitted and provides I and Q analog output signals to the transmitter 1208. In the exemplary wireless communications device 1200, the data processor 1206 includes digital-to-analog converters (DACs) 1212(1), 1212(2) for converting digital signals generated by the data processor 1206 into the I and Q analog output signals, e.g., I and Q output currents, for further processing.

Within the transmitter 1208, lowpass filters 1214(1), 1214(2) filter the I and Q analog output signals, respectively, to remove undesired signals caused by the prior digital-to-analog conversion. Amplifiers (AMPs) 1216(1), 1216(2) amplify the signals from the lowpass filters 1214(1), 1214(2), respectively, and provide I and Q baseband signals. An upconverter 1218 upconverts the I and Q baseband signals with I and Q transmit (TX) local oscillator (LO) signals from a TX LO signal generator 1222 through mixers 1220(1), 1220(2) to provide an upconverted signal 1224. A filter 1226 filters the upconverted signal 1224 to remove undesired signals caused by the frequency upconversion as well as noise in a receive frequency band. A power amplifier (PA) 1228 amplifies the upconverted signal 1224 from the filter 1226 to obtain the desired output power level and provides a transmit RF signal. The transmit RF signal is routed through a duplexer or switch 1230 and transmitted via an antenna 1232.

In the receive path, the antenna 1232 receives signals transmitted by base stations and provides a received RF signal, which is routed through the duplexer or switch 1230 and provided to a low noise amplifier (LNA) 1234. The duplexer or switch 1230 is designed to operate with a specific receive (RX)-to-TX duplexer frequency separation, such that RX signals are isolated from TX signals. The received RF signal is amplified by the LNA 1234 and filtered by a filter 1236 to obtain a desired RF input signal. Down-conversion mixers 1238(1), 1238(2) mix the output of the filter 1236 with I and Q RX LO signals (i.e., LO_I and LO_Q) from an RX LO signal generator 1240 to generate I and Q baseband signals. The I and Q baseband signals are amplified by AMPs 1242(1), 1242(2) and further filtered by lowpass filters 1244(1), 1244(2) to obtain I and Q analog input signals, which are provided to the data processor 1206. In this example, the data processor 1206 includes analog-to-digital converters (ADCs) 1246(1), 1246(2) for converting the analog input signals into digital signals to be further processed by the data processor 1206.

In the wireless communications device 1200 of FIG. 12, the TX LO signal generator 1222 generates the I and Q TX LO signals used for frequency upconversion, while the RX LO signal generator 1240 generates the I and Q RX LO signals used for frequency downconversion. Each LO signal is a periodic signal with a particular fundamental frequency. A TX phase-locked loop (PLL) circuit 1248 receives timing information from the data processor 1206 and generates a control signal used to adjust the frequency and/or phase of the TX LO signals from the TX LO signal generator 1222. Similarly, an RX PLL circuit 1250 receives timing information from the data processor 1206 and generates a control signal used to adjust the frequency and/or phase of the RX LO signals from the RX LO signal generator 1240.

Wireless communications devices 1200 that each include an exemplary IC package including a heat-generating device and an electrical device on a surface of a substrate, and a thermal structure that is spaced from the electrical device and on a first surface of the heat-generating device to reduce thermal resistance for heat dissipation, as illustrated in FIGS. 2, 3D, and 5D, and according to any of the aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 13:
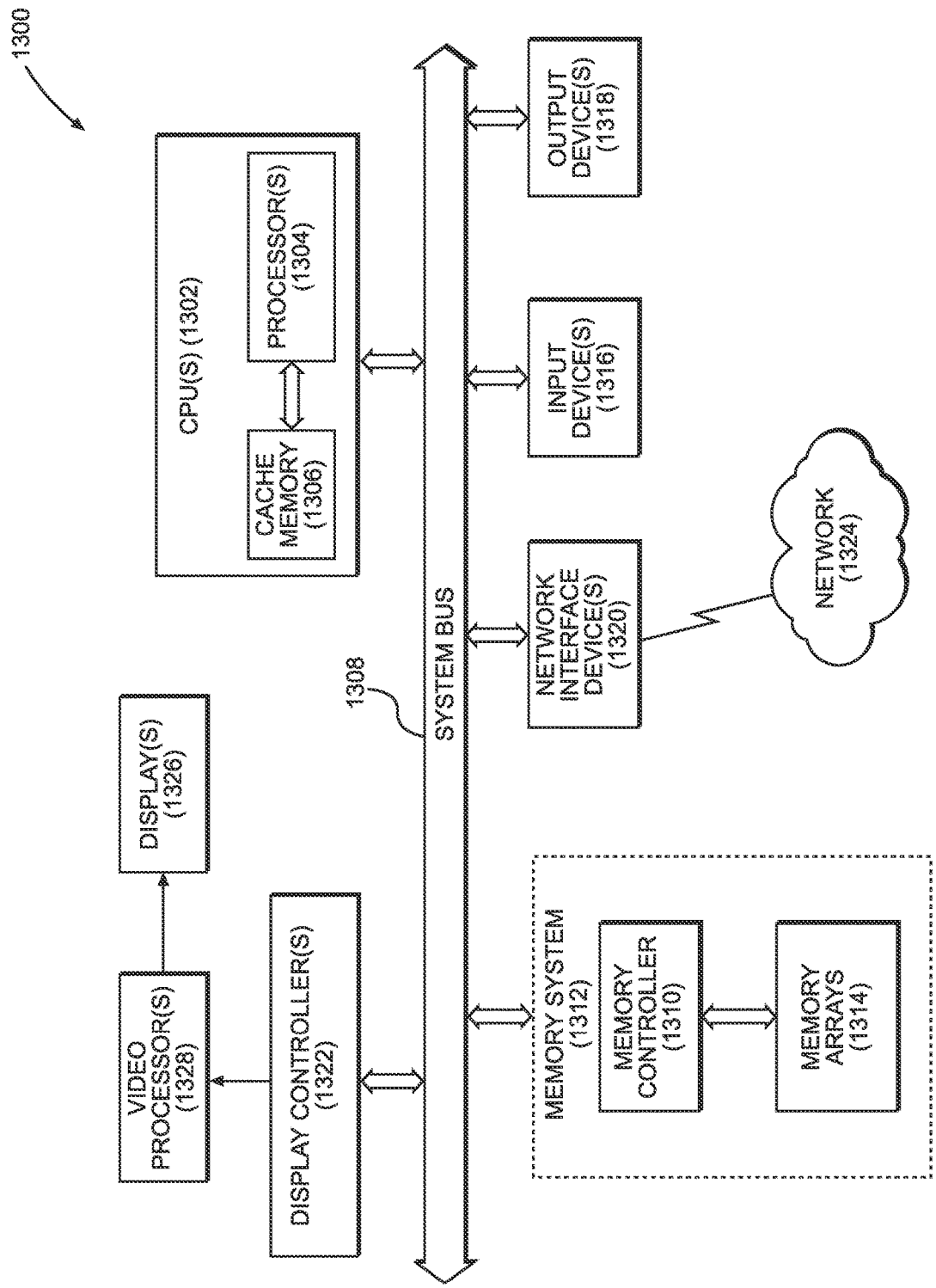
FIG. 13 is a block diagram of an exemplary IC package including a heat-generating device and an electrical device on a surface of a substrate, and a thermal structure that is spaced from the electrical device and on a first surface of the heat-generating device to reduce thermal resistance for heat dissipation, as illustrated in FIGS. 2, 3D, and 5D, and according to any of the aspects disclosed herein.

In this regard, FIG. 13 illustrates an example of a processor-based system 1300 including an exemplary IC package including a heat-generating device and an electrical device on a surface of a substrate, and a thermal structure that is spaced from the electrical device and on a first surface of the heat-generating device to reduce thermal resistance for heat dissipation, as illustrated in FIGS. 2, 3D, and 5D, and according to any aspects disclosed herein. In this example, the processor-based system 1300 includes one or more central processor units (CPUs) 1302, which may also be referred to as CPU or processor cores, each including one or more processors 1304. The CPU(s) 1302 may have cache memory 1306 coupled to the processor(s) 1304 for rapid access to temporarily stored data. As an example, the processor(s) 1304 could include an exemplary IC package including a heat-generating device and an electrical device on a surface of a substrate, and a thermal structure that is spaced from the electrical device and on a first surface of the heat-generating device to reduce thermal resistance for heat dissipation, as illustrated in FIGS. 2, 3D, and 5D, and according to any aspects disclosed herein. The CPU(s) 1302 is coupled to a system bus 1308 and can intercouple master and slave devices included in the processor-based system 1300. As is well known, the CPU(s) 1302 communicates with these other devices by exchanging address, control, and data information over the system bus 1308. For example, the CPU(s) 1302 can communicate bus transaction requests to a memory controller 1310 as an example of a slave device. Although not illustrated in FIG. 13, multiple system buses 1308 could be provided, wherein each system bus 1308 constitutes a different fabric.

Other master and slave devices can be connected to the system bus 1308. As illustrated in FIG. 13, these devices can include a memory system 1312 that includes the memory controller 1310 and one or more memory arrays 1314, one or more input devices 1316, one or more output devices 1318, one or more network interface devices 1320, and one or more display controllers 1322, as examples. Each of the memory system 1312, the one or more input devices 1316, the one or more output devices 1318, the one or more network interface devices 1320, and the one or more display controllers 1322 can include an exemplary IC package including a heat-generating device and an electrical device on a surface of a substrate, and a thermal structure that is spaced from the electrical device and on a first surface of the heat-generating device to reduce thermal resistance for heat dissipation, as illustrated in FIGS. 2, 3D, and 5D, and according to any of the aspects disclosed herein. The input device(s) 1316 can include any type of input device, including, but not limited to, input keys, switches, voice processors, etc. The output device(s) 1318 can include any type of output device, including, but not limited to, audio, video, other visual indicators, etc. The network interface device(s) 1320 can be any device configured to allow exchange of data to and from a network 1324. The network 1324 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1320 can be configured to support any type of communications protocol desired.

The CPU(s) 1302 may also be configured to access the display controller(s) 1322 over the system bus 1308 to control information sent to one or more displays 1326. The display controller(s) 1322 sends information to the display(s) 1326 to be displayed via one or more video processors 1328, which process the information to be displayed into a format suitable for the display(s) 1326. The display(s) 1326 can include any type of display, including, but not limited to, a cathode ray tube (CRT), a liquid crystal display (LCD), a plasma display, a light emitting diode (LED) display, etc. The display controller(s) 1322, display(s) 1326, and/or the video processor(s) 1328 can include an exemplary IC package including a heat-generating device and an electrical device on a surface of a substrate, and a thermal structure that is spaced from the electrical device and on a first surface of the heat-generating device to reduce thermal resistance for heat dissipation, as illustrated in FIGS. 2, 3D, and 5D, and according to any of the aspects disclosed herein.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Implementation examples are described in the following numbered aspects:

1. An integrated circuit (IC) package, comprising:
    a substrate comprising a surface;
    a heat-generating device on the surface of the substrate, the heat-generating device comprising a first surface at a first distance from the surface;
    an electrical device on the surface of the substrate, the electrical device comprising a second surface at a second distance greater than the first distance from the surface;
    a mold compound disposed on the second surface of the electrical device and comprising a third surface at a third distance greater than the second distance from the surface; and
    a thermal structure formed on the first surface of the heat-generating device and on the third surface of the mold compound, the thermal structure comprising a planar exterior surface.

2. The IC package of aspect 1, wherein the thermal structure further comprises a thermal interface material (TIM) layer on the first surface of the heat-generating device, wherein a thickness of the TIM layer extends from the first surface of the heat-generating device to a fourth surface of the TIM layer at a fourth distance that is greater than the first distance and equal to or less than the third distance from the surface.

3. The IC package of aspect 2, wherein the thermal structure further comprises a heat sink disposed on the fourth surface of the TIM layer and on the third surface of the mold compound, wherein the heat sink comprises the planar exterior surface at a fifth distance greater than the fourth distance from the surface.

4. The IC package of aspect 3, wherein the heat sink further comprises a first thickness from the fourth surface of the TIM layer to the planar exterior surface and a second thickness from the third surface of the mold compound to the planar exterior surface.

5. The IC package of aspect 3 or aspect 4, further comprising:
    a second heat-generating device comprising a sixth surface at a sixth distance less than the second distance of the second surface of the electrical device from the surface; and
    a second TIM layer formed on the sixth surface between the second heat-generating device and the heat sink.

6. The IC package of any of aspects 1 to 5, further comprising:
    a third device comprising a seventh surface at a seventh distance greater than the first distance of the first surface of the heat-generating device from the surface, wherein the mold compound is disposed on the seventh surface of the third device.

7. The IC package of any of aspects 1 to 6, wherein the heat-generating device comprises a power management integrated circuit (PMIC).

8. The IC package of any of aspects 1 to 7, wherein the electrical device comprises a passive electrical component.

9. The IC package of aspect 8, wherein the passive electrical component comprises one of an inductor, a capacitor, and a resistor.

10. The IC package of any of aspects 1 to 9, wherein:
    the substrate comprises a first substrate further comprising a second surface; and
    the IC package further comprises an IC or a package coupled to the second surface of the first substrate.

11. The IC package of aspect 10, further comprising a second substrate coupled to the second surface of the first substrate.

12. The IC package of any of aspects 1 to 9 comprising a radio-frequency (RF) front end (RFFE) module.

13. The IC package of any of aspects 1 to 12 integrated into a device selected from the group consisting of: a set top box; an entertainment unit; a navigation device, a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

14. A method of making an integrated circuit (IC) package, the method comprising:
    coupling a heat-generating device to a surface of a substrate, the heat-generating device comprising a first surface at a first distance from the surface;
    coupling an electrical device to the surface, the electrical device comprising a second surface at a second distance greater than the first distance from the surface; and
    forming a thermal structure on the first surface of the heat-generating device and spaced from the second surface of the electrical device and comprising a planar exterior surface.

15. The method of aspect 14, wherein forming the thermal structure further comprises forming a thermal interface material (TIM) layer on the first surface of the heat-generating device, the TIM layer comprising a fourth surface.

16. The method of aspect 15, further comprising forming a heat sink comprising:
   forming a first portion of the heat sink on the fourth surface of the TIM layer; and
   forming a second portion of the heat sink spaced from the second surface of the electrical device,
   wherein the heat sink comprises the planar exterior surface of the thermal structure.

17. The method of aspect 16, wherein forming the heat sink further comprises:
   forming the first portion of the heat sink to have a first thickness of the heat sink extending from the fourth surface of TIM layer to the planar exterior surface; and
   forming the second portion of the heat sink to extend from the planar exterior surface and have a second thickness less than a distance from the planar exterior surface to the second surface of the electrical device.

18. The method of any of aspects 14 to 17, further comprising disposing a mold compound on the surface of the substrate and on the second surface of the electrical device.

19. The method of aspect 18, wherein disposing the mold compound comprises injecting the mold compound between the second surface of the electrical device and the heat sink in a transfer mold process.

20. The method of any of aspects 14 to 19, further comprising selectively forming a mold compound on the second surface of the electrical device and not on the first surface of the heat-generating device.

21. The method of any of aspects 14 to 20, further comprising:
   forming a mold compound on the first surface of the heat-generating device and on the second surface of the electrical device; and
   removing the mold compound from the first surface of the heat-generating device.

22. The method of any of aspects 14 to 21, wherein forming the thermal structure on the first surface of the heat-generating device further comprises forming the thermal structure directly on the first surface of the heat-generating device, without a mold compound between the first surface and the thermal structure.

23. The method of any of aspects 16 to 22, wherein the heat sink further comprises a thermally conductive material extending continuously from the first portion to the second portion.

What is claimed is:

1. An integrated circuit (IC) package, comprising:
   a substrate comprising a surface;
   a heat-generating device on the surface of the substrate, the heat-generating device comprising a first surface at a first distance from the surface;
   an electrical device on the surface of the substrate, the electrical device comprising a second surface at a second distance greater than the first distance from the surface;
   a mold compound disposed on the second surface of the electrical device and comprising a third surface at a third distance greater than the second distance from the surface; and
   a thermal structure formed directly on the first surface of the heat-generating device and on the third surface of the mold compound on the electrical device, the thermal structure comprises a planar surface.

2. The IC package of claim 1, wherein the thermal structure further comprises a thermal interface material (TIM) layer on the first surface of the heat-generating device, wherein a thickness of the TIM layer extends from the first surface of the heat-generating device to a fourth surface of the TIM layer at a fourth distance that is greater than the first distance and equal to or less than the third distance from the surface.

3. The IC package of claim 2, wherein the thermal structure further comprises a heat sink disposed on the fourth surface of the TIM layer and on the third surface of the mold compound, wherein the heat sink comprises the planar surface at a fifth distance greater than the fourth distance from the surface.

4. The IC package of claim 3, wherein the heat sink further comprises a first thickness from the fourth surface of the TIM layer to the planar surface and a second thickness from the third surface of the mold compound to the planar surface.

5. The IC package of claim 3, further comprising:
   a second heat-generating device comprising a sixth surface at a sixth distance less than the second distance of the second surface of the electrical device from the surface; and
   a second TIM layer formed on the sixth surface between the second heat-generating device and the heat sink.

6. The IC package of claim 1, further comprising:
   a third device comprising a seventh surface at a seventh distance greater than the first distance of the first surface of the heat-generating device from the surface,
   wherein the mold compound is disposed on the seventh surface of the third device.

7. The IC package of claim 1, wherein the heat-generating device comprises a power management integrated circuit (PMIC).

8. The IC package of claim 1, wherein the electrical device comprises a passive electrical component.

9. The IC package of claim 8, wherein the passive electrical component comprises one of an inductor, a capacitor, and a resistor.

10. The IC package of claim 1, wherein:
   the substrate comprises a first substrate further comprising a second surface; and
   the IC package further comprises an IC or a package coupled to the second surface of the first substrate.

11. The IC package of claim 10, further comprising a second substrate coupled to the second surface of the first substrate.

12. The IC package of claim 1 comprising a radio-frequency (RF) front end (RFFE) module.

13. The IC package of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

14. A method of making an integrated circuit (IC) package, the method comprising:

coupling a heat-generating device to a surface of a substrate, the heat-generating device comprising a first surface at a first distance from the surface;

coupling an electrical device to the surface, the electrical device comprising a second surface at a second distance greater than the first distance from the surface;

disposing a mold compound on the surface of the substrate and on the second surface of the electrical device, the mold compound comprising a third surface at a third distance greater than the second distance from the surface; and forming a thermal structure directly on the first surface of the heat-generating device and on the third surface of the mold compound on the electrical device, the thermal structure comprising a planar surface.

15. The method of claim 14, wherein forming the thermal structure further comprises forming a thermal interface material (TIM) layer on the first surface of the heat-generating device, the TIM layer comprising a fourth surface.

16. The method of claim 15, further comprising forming a heat sink comprising:

forming a first portion of the heat sink on the fourth surface of the TIM layer; and forming a second portion of the heat sink spaced from the second surface of the electrical device, wherein the heat sink comprises the planar surface of the thermal structure.

17. The method of claim 16, wherein forming the heat sink further comprises:

forming the first portion of the heat sink to have a first thickness of the heat sink extending from the fourth surface of TIM layer to the planar surface; and forming the second portion of the heat sink to extend from the planar surface and have a second thickness less than a distance from the planar surface to the second surface of the electrical device.

18. The method of claim 14, wherein disposing the mold compound comprises injecting the mold compound between the second surface of the electrical device and the heat sink in a transfer mold process.

19. The method of claim 14, further comprising selectively forming a mold compound on the second surface of the electrical device and not on the first surface of the heat-generating device.

20. The method of claim 14, further comprising:

forming a mold compound on the first surface of the heat-generating device and on the second surface of the electrical device; and removing the mold compound from the first surface of the heat-generating device.

21. The method of claim 14, wherein forming the thermal structure directly on the first surface of the heat-generating device further comprises forming the thermal structure directly on the first surface of the heat-generating device, without a mold compound between the first surface and the thermal structure.

22. The method of claim 16, wherein the heat sink further comprises a thermally conductive material extending continuously from the first portion to the second portion.

* * * * *